(12) United States Patent
Doyle et al.

(10) Patent No.: US 10,750,623 B2
(45) Date of Patent: Aug. 18, 2020

(54) FORMING CONDUCTIVE VIAS USING HEALING LAYER

(71) Applicant: International Business Machines Corporation, Armonk, NY (US)

(72) Inventors: Matthew S. Doyle, Chatfield, MN (US); Joseph Kuczynski, North Port, FL (US); Phillip V. Mann, Rochester, MN (US); Kevin M. O'Connell, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 504 days.

(21) Appl. No.: 15/593,610

(22) Filed: May 12, 2017

(65) Prior Publication Data

US 2018/0332719 A1 Nov. 15, 2018

(51) Int. Cl.
*H05K 3/42* (2006.01)
*H05K 3/00* (2006.01)

(52) U.S. Cl.
CPC ............ *H05K 3/429* (2013.01); *H05K 3/0094* (2013.01); *H05K 3/0047* (2013.01); *H05K 3/421* (2013.01); *H05K 2201/0254* (2013.01); *H05K 2201/09509* (2013.01); *H05K 2201/09563* (2013.01)

(58) Field of Classification Search
CPC .... H05K 3/0047; H05K 3/0094; H05K 3/421; H05K 3/429; H05K 2201/0254; H05K 2201/09509; H05K 2201/09563
See application file for complete search history.

(56) References Cited

U.S. PATENT DOCUMENTS

| | | | | |
|---|---|---|---|---|
| 4,859,571 A | * | 8/1989 | Cohen | G03F 7/0047 430/272.1 |
| 4,940,623 A | * | 7/1990 | Bosna | C23C 4/02 427/275 |
| 5,733,639 A | * | 3/1998 | Gosselin | B32B 5/18 428/209 |

(Continued)

FOREIGN PATENT DOCUMENTS

CN 103429012 A 12/2013

OTHER PUBLICATIONS

White et al., "Restoration of large damage volumes in polymers", Science, 344, pp. 620-623 (2014).

(Continued)

*Primary Examiner* — Peter Dungba Vo
*Assistant Examiner* — Jeffrey T Carley
(74) *Attorney, Agent, or Firm* — Patterson + Sheridan, LLP

(57) ABSTRACT

A method and associated apparatus are disclosed for forming a conductive via that extends partly through a multi-layer assembly, wherein the method comprises forming a cavity from a surface of the multi-layer assembly to a first depth. The cavity extends through a plurality of layers of the multi-layer assembly. The plurality of layers comprises a healing layer comprising a plurality of microcapsules. Forming the cavity ruptures some of the plurality of microcapsules to release encapsulated material into the cavity. The released encapsulated material defines a second depth from the surface, the second depth being closer to the surface than the first depth. The method further comprises depositing conductive material within the cavity to form the conductive via that extends to the second depth.

10 Claims, 6 Drawing Sheets

(56) References Cited

U.S. PATENT DOCUMENTS

| | | | | |
|---|---|---|---|---|
| 6,010,768 | A | * | 1/2000 | Yasue .................. H05K 3/0094 |
| | | | | 174/255 |
| 7,220,785 | B2 | * | 5/2007 | Saito ...................... C08G 59/18 |
| | | | | 257/E21.514 |
| 7,337,537 | B1 | | 3/2008 | Smetana, Jr. |
| 8,302,301 | B2 | | 11/2012 | Lau |
| 9,831,211 | B2 | * | 11/2017 | Chu ........................ H01L 24/33 |
| 2007/0062730 | A1 | | 3/2007 | Murry |
| 2007/0246252 | A1 | | 10/2007 | Buchwalter et al. |
| 2009/0188710 | A1 | | 7/2009 | Senk |
| 2012/0067615 | A1 | * | 3/2012 | Blaiszik .................. H01B 1/02 |
| | | | | 174/110 R |
| 2012/0211273 | A1 | | 8/2012 | Kuczynski et al. |
| 2014/0170381 | A1 | * | 6/2014 | He .......................... H01L 24/29 |
| | | | | 428/142 |
| 2015/0282329 | A1 | * | 10/2015 | Baker .................... H05K 3/284 |
| | | | | 427/96.2 |
| 2017/0053847 | A1 | * | 2/2017 | Takematsu ............ H01L 23/295 |

OTHER PUBLICATIONS

White, et. al, "Supplementary Material for Restoration of Large Damage Volumes in Polymers," Science Magazine, Published May 9, 2014, 15 pages.

\* cited by examiner

FORMING CONDUCTIVE VIAS USING HEALING LAYER

BACKGROUND

The present disclosure relates to manufacturing multi-layer electronic circuits, and more specifically, techniques for forming conductive vias between conductive layers of the multi-layer electronic circuits using a healing layer.

Within multi-layer electronic circuits, such as printed circuit boards (PCBs), conductive vias may be used to form connections between the different conductive layers. In some cases, the vias are formed as "barrels" or conductive cylinders that extend at least partway through the multi-layer electronic circuit. Controlling the dimensions of the vias may have increased importance with increased data speeds of the multi-layer electronic circuits. For example, the stubs of the vias can cause unwanted resonant frequency nulls which appear in the insertion loss plot of the channel. If the resonant frequency null occurs near the Nyquist frequency corresponding to the bit rate, a high bit-error-rate or even a link failure may result. Generally, reducing the via stub length can shift the resonant frequency nulls away from the Nyquist frequency, and improve communication performance and/or reliability.

Mechanical techniques such as back-drilling may be used to control the stub length of vias. However, back-drilling tends to increase the manufacturing costs and may suffer reliability issues. Further, once a via has been back-drilled, it may be no longer possible to probe the location of the via on the multi-layer electronic circuits. Thus, using back-drilled vias it may be difficult to manufacture cost-effective PCBs, measure high-speed interfaces during system bring-up and model-to-hardware correlation activities, and/or maximize the electrical performance of the interfaces.

SUMMARY

According to one embodiment, a method of forming a conductive via that extends partly through a multi-layer assembly comprises forming a cavity from a surface of the multi-layer assembly to a first depth. The cavity extends through a plurality of layers of the multi-layer assembly. The plurality of layers comprises a healing layer comprising a plurality of microcapsules. Forming the cavity ruptures some of the plurality of microcapsules to release encapsulated material into the cavity. The released encapsulated material defines a second depth from the surface, the second depth being closer to the surface than the first depth. The method further comprises depositing conductive material within the cavity to form the conductive via that extends to the second depth.

According to another embodiment, an apparatus comprises a plurality of conductive layers that are separated from each other and that are arranged substantially parallel to each other within a multi-layer assembly, and at least a first healing layer disposed in the multi-layer assembly, the first healing layer comprising a plurality of microcapsules. The plurality of microcapsules are configured to, when a cavity is formed from a surface of the multi-layer assembly and extending through the first healing layer to a first depth from the surface, release encapsulated material into the cavity. When conductive material is deposited in the cavity to form a conductive via that couples a first conductive layer and a second conductive layer of the plurality of conductive layers, the released encapsulated material limits an extent of the conductive via through the multi-layer assembly.

According to yet another embodiment, a method of forming conductive vias that extend at least partly through a multi-layer assembly comprises drilling a first cavity from a surface of the multi-layer assembly to a first depth from the surface. The first cavity extends through a plurality of layers of the multi-layer assembly. The plurality of layers comprises a healing layer comprising a plurality of microcapsules within a first portion. Drilling the first cavity ruptures some of the plurality of microcapsules to release encapsulated material into the first cavity. The released encapsulated material defines a second depth from the surface, the second depth being closer to the surface than the first depth. The method further comprises drilling a second cavity from the surface to a third depth from the surface that is different than the second depth, the second cavity extending through a second portion of the healing layer that does not include any of the plurality of microcapsules, and depositing conductive material within each of the first cavity and the second cavity to respectively form a first conductive via extending to the second depth and a second conductive via extending to the third depth.

DETAILED DESCRIPTION

Figure 1:
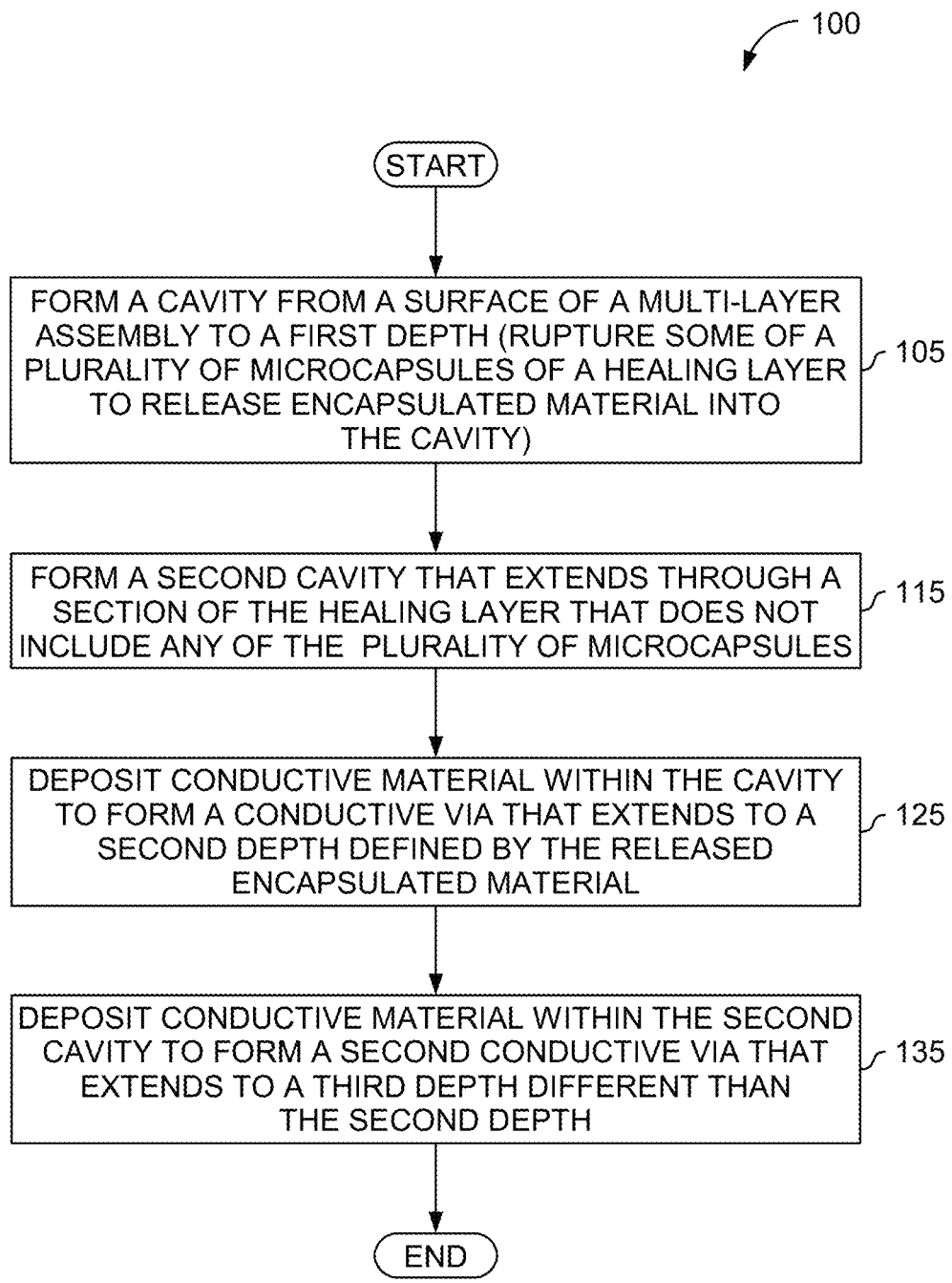
FIG. 1 illustrates a method of forming a conductive via that extends partly through a multi-layer assembly, according to embodiments described herein.
Figures 2A, 2B:
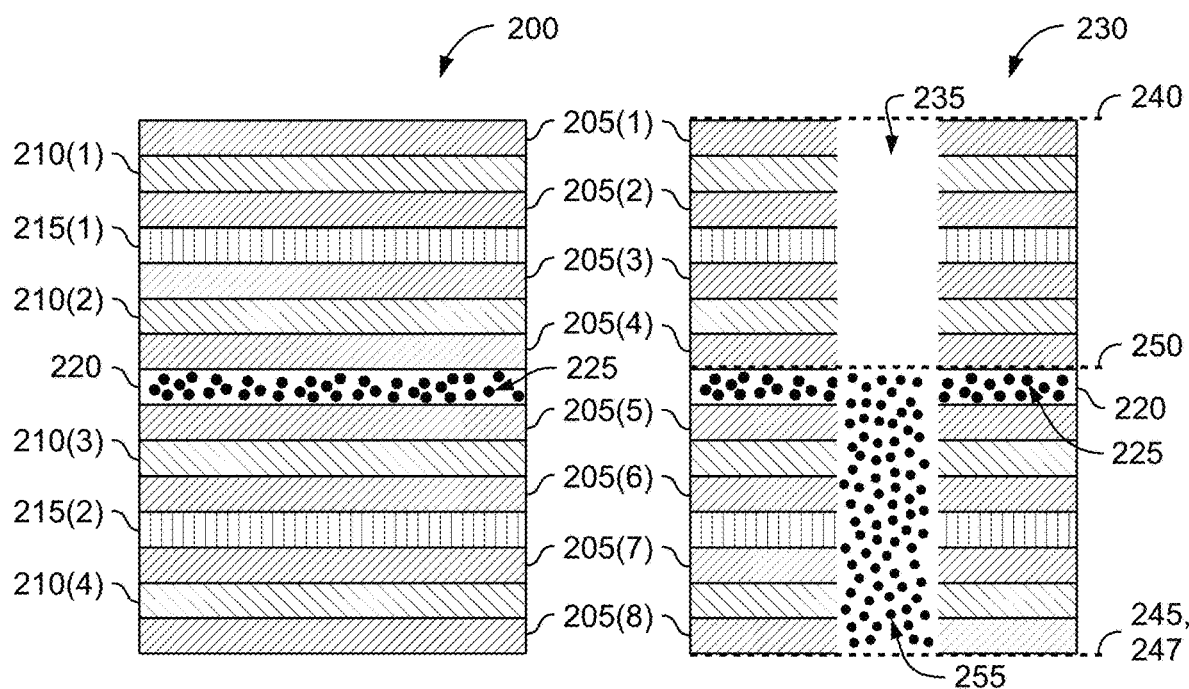
FIGS. 2A-2D are diagrams illustrating formation of a conductive via that extends partly through a multi-layer assembly, according to embodiments described herein.
Figures 2C, 2D:
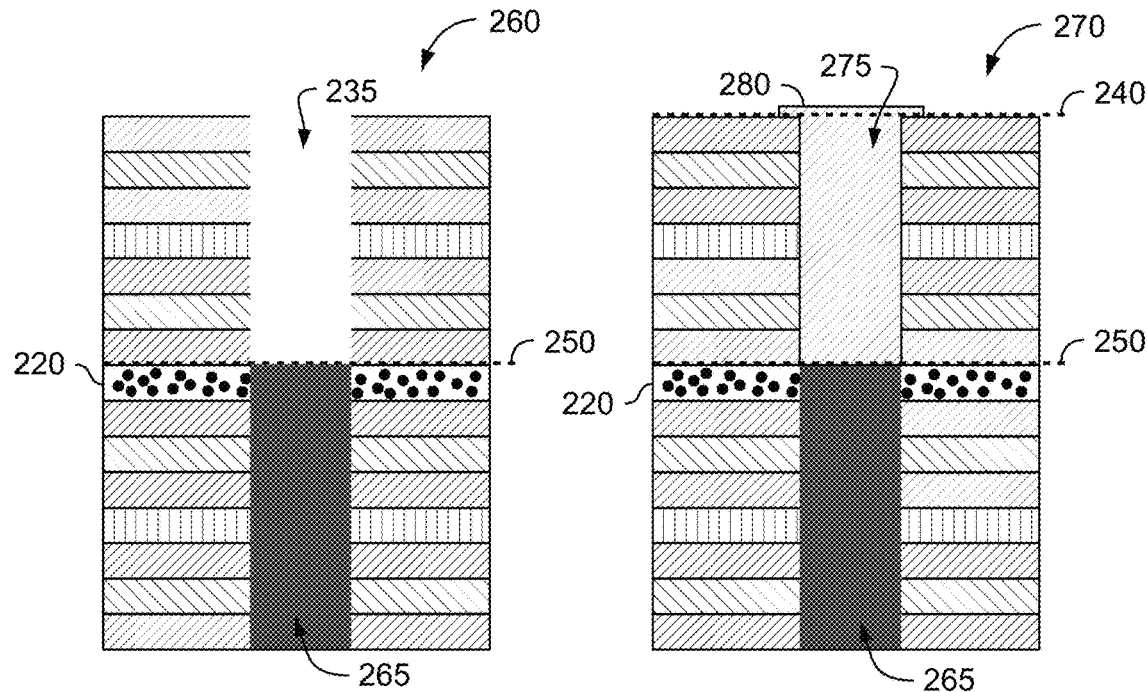

The descriptions of the various embodiments of the present disclosure are presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, any reference to "the invention" shall not be construed as a generalization of any inventive subject matter disclosed herein and shall not be considered to be an element or limitation of the appended claims except where explicitly recited in a claim(s).

Aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system."

Various embodiments disclosed herein are directed to forming conductive vias using one or more healing layers included in the multi-layer electronic circuit. Each healing layer comprises a plurality of microcapsules. In some embodiments, forming a via in the multi-layer electronic circuit includes drilling (or otherwise forming) a cavity from a surface to a first depth at the planned location of the via. In some embodiments, the cavity extends through a healing layer and forming the cavity ruptures some of the plurality of microcapsules. The ruptured microcapsules release encapsulated material into the cavity, which defines a second depth from the surface, the second depth being closer to the surface than the first depth. Forming the via may further include plating the cavity by depositing conductive material therein. The released encapsulated material limits an extent of the conductive via to the second depth. In this way, the depth of the via may be controlled without requiring back-drilling. In some embodiments, the via is formed substantially without forming a via stub. Some benefits of the embodiments disclosed herein include reduced manufacturing complexity and costs for the multi-layer electronic circuit, as well as maximizing interface margins.

FIG. 1 illustrates a method 100 of forming a conductive via that extends partly through a multi-layer assembly, according to embodiments described herein. The method 100 may be used in conjunction with other embodiments disclosed herein, such as the multi-layer assembly depicted in FIGS. 2A-2D, 3A-3C, and 4. Method 100 is generally performed using any suitable manufacturing equipment. In some embodiments, the method 100 is performed using PCB manufacturing equipment and/or processes that are known to a person of ordinary skill in the art, such as drilling and plating processes.

Method 100 begins at block 105, where the manufacturing equipment forms a cavity from a surface of a multi-layer assembly to a first depth from the surface. In some embodiments, the manufacturing equipment comprises a drill element configured to drill into the multi-layer assembly to form the cavity. The cavity extends through a plurality of layers of the multi-layer assembly. In some cases, the first depth is such that the cavity extends entirely through the multi-layer assembly to an opposing external surface. In other cases, the first depth extends only partway through the multi-layer assembly.

In some embodiments, forming a cavity may be performed before applying one or more layers of the multi-layer assembly. Described another way, the techniques described herein are suitable for forming blind vias that extend from an external surface to an inner layer, as well as buried vias that connects one or more inner layers of the multi-layer assembly.

Forming the cavity from the surface to the first depth extends through a plurality of layers, which includes a healing layer comprising a plurality of microcapsules. Forming the cavity through the healing layer causes the rupture of at least some of the plurality of microcapsules, which releases encapsulated material into the cavity.

Each of the microcapsules includes one or more encapsulated materials within a selected encapsulating material. In some embodiments, a size of each microcapsule is between about 1 micron and 1000 microns in diameter, although larger and smaller sizes are also possible. The encapsulating material may be included in any suitable form, such as shells that encapsulate individual particles, as a matrix or other cellular structure, and so forth. Some non-limiting examples of an encapsulating material include polymers, glass, and ceramics. In one embodiment, the healing layer and the encapsulating material comprise an epoxy used in PCB manufacturing processes.

In some embodiments, the encapsulating material may be polymer-based, which may be relatively simple to form and/or control dimensions. Alternate embodiments may include filling glass spheres or ceramic spheres with the desired healing chemistry. In one embodiment, one microcapsule 135 (or type of microcapsules 135) include an epoxy resin (e.g., the duglycidyl ether of bis-phenol A or a cycloaliphatic epoxide) while another microcapsule 135 (or type of microcapsules 135) include a suitable curing agent (dicyandiamide, anhydrides, Lewis acids, or any other epoxy curing agent known to one skilled in the art). In another embodiment, a microcapsule 135 may be a shell-in-shell microcapsule, wherein the inner shell includes the curing agent and the outer shell contains the epoxide. Upon rupture of the microcapsule 135, the different components combine and the epoxy is cured as the different components are reverse transcription (RT) reactive.

In some embodiments, the materials encapsulated in the microcapsules include one or more active agents that are configured to perform a chemical reaction when some of the microcapsules are ruptured. For example, a first portion of the microcapsules may include an active agent configured to react with a chemical that is included in a second portion of the microcapsules 135. In some embodiments, the first portion of the microcapsules includes a first reactive monomer solution, and the second portion of the microcapsules includes a second reactive monomer solution.

The first reactive monomer solution and second reactive monomer solution may be selected according to any number of desired characteristics, such as a desired boiling point, nonwetting properties, desired viscosity, desired cure kinetics, a desired ability to dissolve gelators, and so forth. Some non-limiting examples of monomer solutions include organic liquids such as acrylic and thiol-ene monomers. The first reactive monomer solution and second reactive monomer solution may each comprise gelators that, when combined in the cavity, perform a gelation process form in a first stage. The combined reactive monomer solutions may perform a polymerization process in a second stage, forming a monolithic (polymer) plug in the cavity having desired properties. In some embodiments, the monolithic plug is adjacent to the subsequently formed conductive via and limits the extent of the via within the cavity.

The first reactive monomer solution and/or second reactive monomer solution may further comprise gel catalysts, promoters, initiators, and/or monomers in suitable concentrations to achieve the first and/or second stage processes. In some embodiments, the first reactive monomer solution and second reactive monomer solution are selected according to techniques described in S. R. White et al., "Restoration of Large Damage Volumes in Polymers," Science, Vol 344, May 9, 2014, pp. 620-623. This article is herein incorporated by reference in its entirety, and is herewith cited in an Information Disclosure Statement. One suitable example of the first reactive monomer solution is a 2-hydroxyethyl methacrylate (HEMA) solution that includes: bis-acylhydrazine-terminated poly (ethylene glycol) as a first gelator, dichloroacetic acid as a gel catalyst, and cobalt naphthenate (CoNp) as a promoter. One suitable example of the second reactive monomer solution is a HEMA solution that includes: bis-acylhydrazine tris[(4-formylphenoxy)methyl] ethane as a second gelator, and methyl ethyl ketone peroxide (MEKP) as an initiator.

In some embodiments, the release of the reactive monomer solutions forms a thermosetting resin in the cavity that, when cured, forms the monolithic plug in the cavity. The curing process may include the application of heat, radiation, and/or pressure, as is known to the person of ordinary skill in the art. To form a thermosetting resin, one suitable example of a first reactive monomer solution is liquid thiol-ene agents 1,3-glyceryl dimethacrylate, and a second reactive monomer solution is trimethylolpropane tris(3-mercaptopropionate).

In some embodiments, the one or more materials encapsulated by the microcapsules may be selected such that the plug formed in the cavity has desired electrical properties, such as a relative permittivity (or "dielectric constant"). More specifically, the dielectric constant may be selected such that the monolithic plug exhibits desired radio frequency (RF) signal reflective properties, such as a reflection coefficient. In one embodiment, the plurality of layers comprises a dielectric layer having a first dielectric constant, and the released encapsulated material forms a plug in the cavity having a second dielectric constant that is substantially the same as the first dielectric constant. Thus, techniques described herein may provide improved communication performance and/or reliability of the multi-layer assembly through (1) controlling the extent of the conductive via in the cavity and/or (2) the plug having a desired signal reflective properties.

At block 115 of the method 100, the manufacturing equipment forms a second cavity that extends through a section of the healing layer that does not include any of the plurality of microcapsules. In this way, vias may be also formed in the multi-layer assembly without causing encapsulated material to be released into the second cavity. In some embodiments, the second cavity extends entirely through the multi-layer assembly to an opposing external surface. In other cases, the second cavity extends only partway through the multi-layer assembly. Exemplary techniques for forming such sections within the healing layer are discussed with respect to FIG. 6, below.

At block 125, the manufacturing equipment deposits conductive material within the cavity to form a conductive via that extends to a second depth from the surface that is defined by the released encapsulated material. The second depth is closer to the surface than the first depth. In some embodiments, the volume defined in the cavity between the first depth and the second depth is a headspace from the surface. In some embodiments, a monolithic plug that is formed in the cavity by the released encapsulated material limits the plating chemistry from depositing conductive material (such as copper) beyond the second depth. At block 135, the manufacturing equipment deposits conductive material within the second cavity to form a second conductive via that extends to a third depth that is different than the second depth. In some embodiments, the third depth is different than the second depth defined in the first cavity. In one embodiment, the third depth is such that the second cavity extends through the multi-layer assembly, and the second conductive via comprises a through hole via. In some embodiments, blocks 125, 135 may be performed as part of a single plating process. Method 100 ends following completion of block 135.

FIGS. 2A-2D are diagrams illustrating formation of a conductive via that extends partly through a multi-layer assembly, according to embodiments described herein. The multi-layer assembly that is depicted at various stages in views 200, 230, 260, 270 may be used in conjunction with other embodiments, such as the method 100 of FIG. 1.

As shown in views 200, 230, 260, 270, the multi-layer assembly comprises a plurality of conductive layers 205(1), 205(2), 205(3), 205(4), 205(5), 205(6), 205(7), 205(8) (described generically as conductive layer 205), a first plurality of dielectric layers 210(1), 210(2), 210(3), 210(4) (described generically as dielectric layer 210), and a second plurality of dielectric layers 215(1), 215(2) (described generically as dielectric layer 215). The multi-layer assembly further comprises a healing layer 220 comprising a plurality of microcapsules 225. The healing layer 220 generally operates as a dielectric layer. Each of the plurality of conductive layers 205 are separated from each other by one of the dielectric layers 210, 215 or by the healing layer 220. While eight conductive layers 205, six dielectric layers 210, 215, and a single healing layer 220 are depicted, different embodiments may include different numbers of conductive layers 205, dielectric layers 210, dielectric layers 215, and/or healing layers 220. Further, although each layer of the multi-layer assembly is depicted with a similar sizing, some embodiments may have at least one layer having a different sizing.

In some embodiments, the outermost conductive layers 205(1), 205(8) comprise copper foil layers, and the inner conductive layers 205(2), 205(3), 205(4), 205(5), 205(6), 205(7) comprise copper layers. In one embodiment, the dielectric layers 210 comprise pre-impregnated ("prepreg") layers of fiberglass impregnated with resin, and the dielectric layers 215 comprise FR-4 layers. Other suitable materials are also possible. In some embodiments, the healing layer 220 is formed of similar materials as one of the dielectric layers 210, 215, but includes the plurality of microcapsules 225. Some examples of suitable chemistry for the plurality of microcapsules 225 have been discussed above.

In view 230, a cavity 235 is formed from a surface 240 of the multi-layer assembly to a first depth 245. The cavity 235 may be formed by drilling or other suitable processes known to the person of ordinary skill in the art. As shown, the first depth 245 corresponds to an external surface 247 that is opposite to the surface 240. Described another way, the cavity 235 extends through the multi-layer assembly. In other embodiments, the first depth 245 is such that the cavity 235 extends only partly through the multi-layer assembly.

The cavity 235 extends through a plurality of layers of the multi-layer assembly (including the healing layer 220), such that forming the cavity 235 ruptures at least some of the plurality of microcapsules 225. The ruptured microcapsules 225 release encapsulated material 255 into the cavity 235. The released encapsulated material 255 fills a portion of the cavity 235 and defines a second depth 250 between the surface 240 and the first depth 245. In some embodiments, the second depth 250 corresponds to the level of the healing layer 220 within the multi-layer assembly.

In view 260, and as discussed above, the released encapsulated material 255 may undergo gelation and/or polymerization processes, or a suitable curing process, to form a monolithic plug 265 in the cavity 235. In view 270, conductive material may be deposited in the cavity 235 (e.g., using a plating process) to form a conductive via 275 that extends from the second depth 250 to the surface 240. The conductive via 275 couples at least a first conductive layer 205(1) and a second conductive layer 205 (4) (as shown, conductive layers 205(1), 205(2), 205(3), 205(4) are coupled), and the healing layer 220 is adjacent to the conductive layer 205(4). As shown, the conductive via 275 is connected to a conductive pad 280.

Figures 3A, 3B:
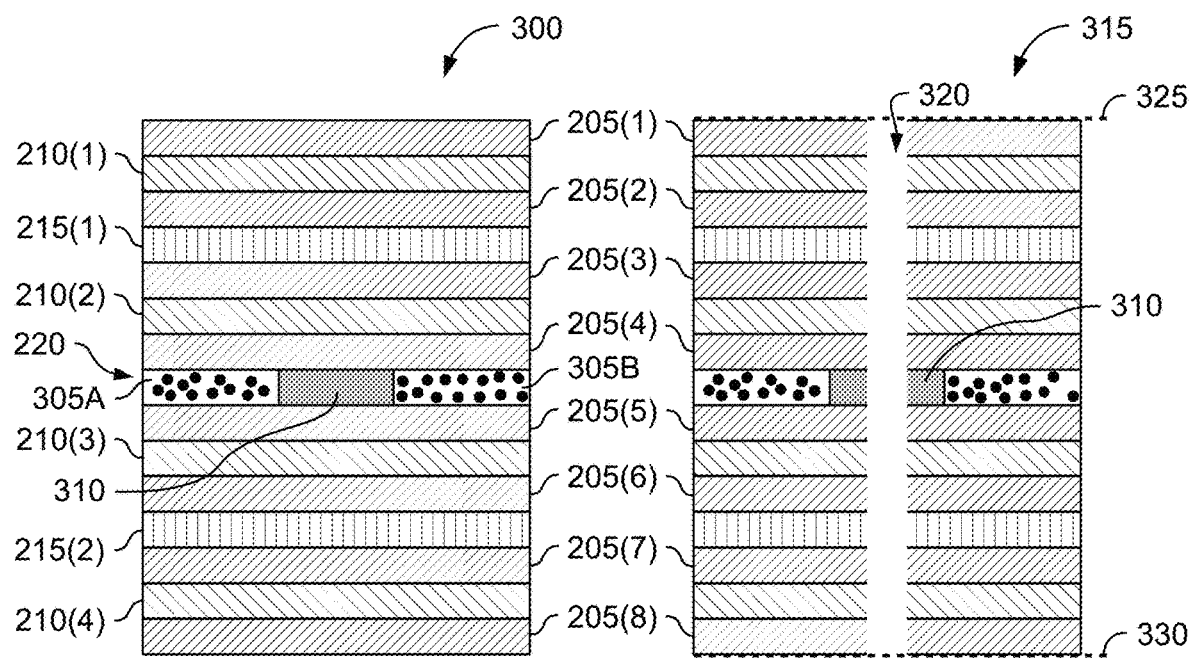
FIGS. 3A-3C are diagrams illustrating formation of a conductive through hole via that extends through a multi-layer assembly, according to embodiments described herein.
Figure 3C:
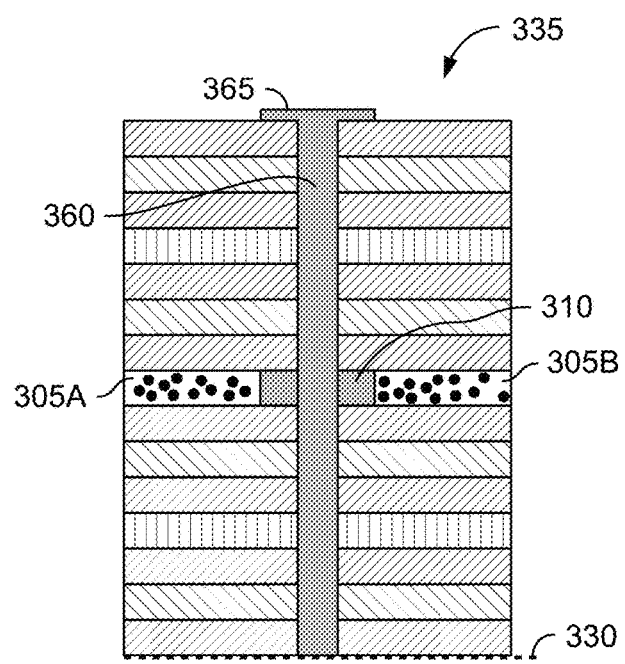

FIGS. 3A-3C are diagrams illustrating formation of a conductive through hole via that extends through a multi-layer assembly, according to embodiments described herein. The multi-layer assembly that is depicted at various stages in views 300, 315, and 335 is similar to the multi-layer assembly depicted in FIGS. 2A-2D, and may also be used in conjunction with other embodiments, such as the method 100 of FIG. 1.

As shown in view 300, the healing layer 220 comprises two sections 305A, 305B that each include a plurality of microcapsules, and one section 310 that does not include any of the plurality of microcapsules. Exemplary techniques of forming one or more sections without microcapsules are discussed with respect to FIGS. 5 and 6, below. As shown in view 315, a cavity 320 may be formed to a first level 330, such that the cavity 320 extends through the section 310 without releasing encapsulated material into the cavity 320. Beneficially, the one or more sections 310 can be arranged in the healing layer 220 such that conductive vias may be formed to different depths in the multi-layer assembly.

In view 335, conductive material is deposited in the cavity 320 (e.g., using a plating process) to form a conductive via 360 that extends from the first depth 330 to the surface. The conductive via 275 couples at least a first conductive layer and a second conductive layer, and is connected to a conductive pad 365.

Figure 4:
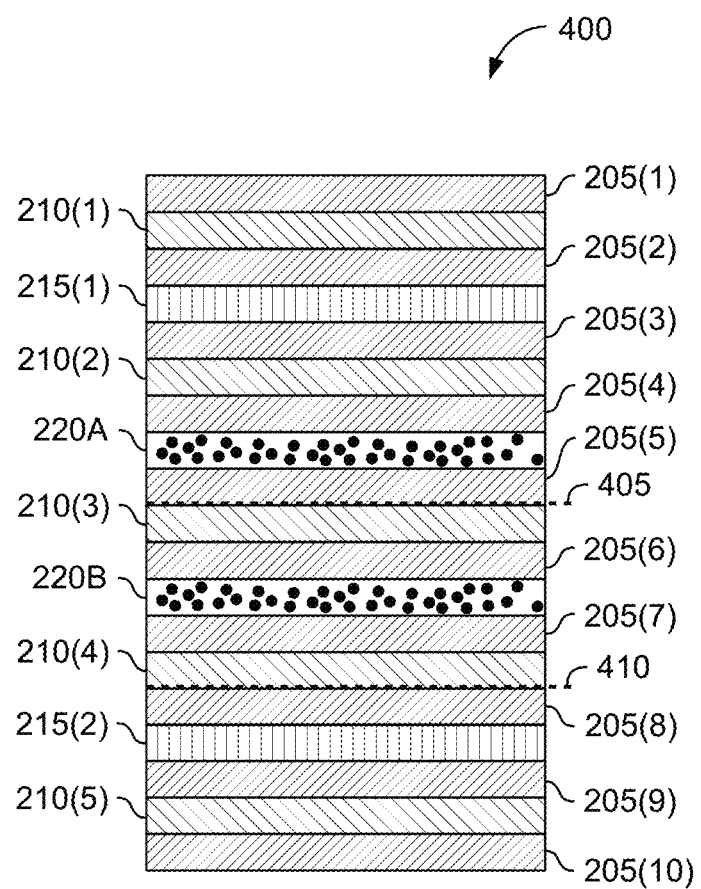
FIG. 4 is a diagram illustrates an exemplary multi-layer assembly having multiple healing layers, according to embodiments described herein.

FIG. 4 is a diagram illustrating an exemplary multi-layer assembly having multiple healing layers, according to embodiments described herein. More specifically, the view 400 depicts a multi-layer assembly having a plurality of conductive layers 205(1), 205(2), 205(3), 205(4), 205(5), 205(6), 205(7), 205(8), 205(9), 205(10). A healing layer 220A is arranged between conductive layers 205(4), 205(5), and a healing layer 220B is arranged between conductive layers 205(6) and 205(7). When a cavity is formed in the multi-layer assembly to a first depth 405, the cavity extends through the healing layer 220A but not through the healing layer 220B. In this case, encapsulated material is released by the healing layer 220A but not by the healing layer 220B. When a cavity is formed to a second depth 410, the cavity extends through both healing layers 220A, 220B, and encapsulated material is released by both healing layers 220A, 220B.

Figure 5:
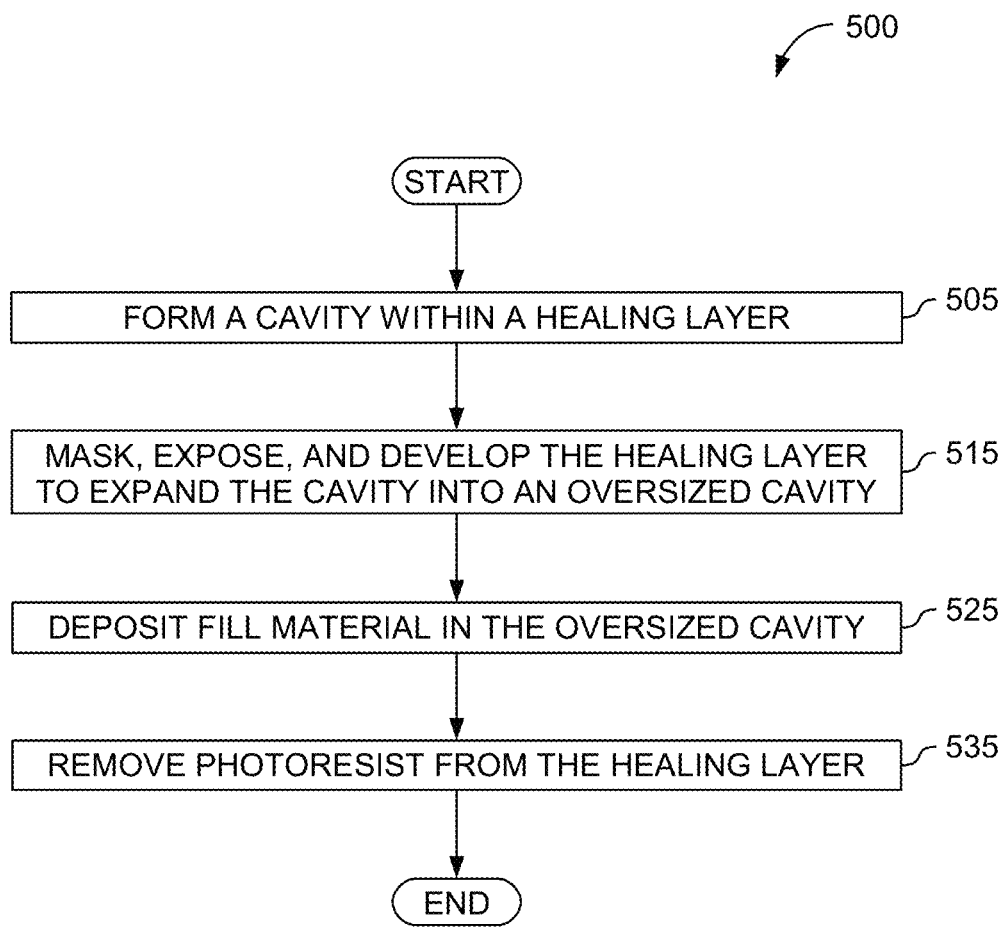
FIG. 5 illustrates a method of forming sections of healing layer that do not include a plurality of microcapsules, according to embodiments described herein.

FIG. 5 illustrates a method 500 of forming sections of a healing layer that do not include a plurality of microcapsules, according to embodiments described herein. Method 500 may be used in conjunction with other embodiments, such as the healing layer 220 illustrated in FIGS. 3A-3C, and is generally performed using any suitable manufacturing equipment.

Method 500 begins at block 505, where the manufacturing equipment forms a cavity within a healing layer. In some embodiments, a drilling element is used to form the cavity. At block 515, the manufacturing equipment masks, exposes, and develops the healing layer to expand the cavity into an oversized cavity. In some embodiments, a photoresist is laminated to the healing layer, and exposed and developed according to known techniques. In some embodiments, the oversized cavity is wider than a width of a drilling element that is subsequently used to form cavities for conductive vias. In this way, during the formation of the conductive vias, cavities formed by the drilling element may pass through the oversized cavity without rupturing any of the plurality of microcapsules and releasing encapsulated material into the cavities. In some embodiments, the same drilling element may be used for forming the cavity in the healing layer and for forming the conductive vias.

At block 525, the manufacturing equipment deposits fill material in the oversized cavity. In some embodiments, the fill material is substantially similar to the material of the healing layer, but does not include a plurality of microcapsules therein. In some embodiments, the fill material comprises an epoxy material. A relative permittivity of the fill material and the healing layer may be similar. In some embodiments, one or more steps are performed to cure or solidify the fill material in the oversized cavity. At block 535, the manufacturing equipment removes the photoresist from the healing layer according to known techniques. Following removal of the photoresists, additional layers may be applied to form a multi-layer assembly, such as those depicted in FIGS. 2A-2D, 3A-3C, and 4. For example, additional conductive and or dielectric layers may be deposited onto the healing layer, laminated to the healing layer, and so forth. Additionally, one or more cavities may be formed through the oversized cavity for a conductive via. The cavities may be formed before and/or after the other layers are applied, which may depend on whether the conductive via to be formed will be a blind via, a buried via, or a through hole via. Method 500 ends following completion of block 535.

Figure 6:
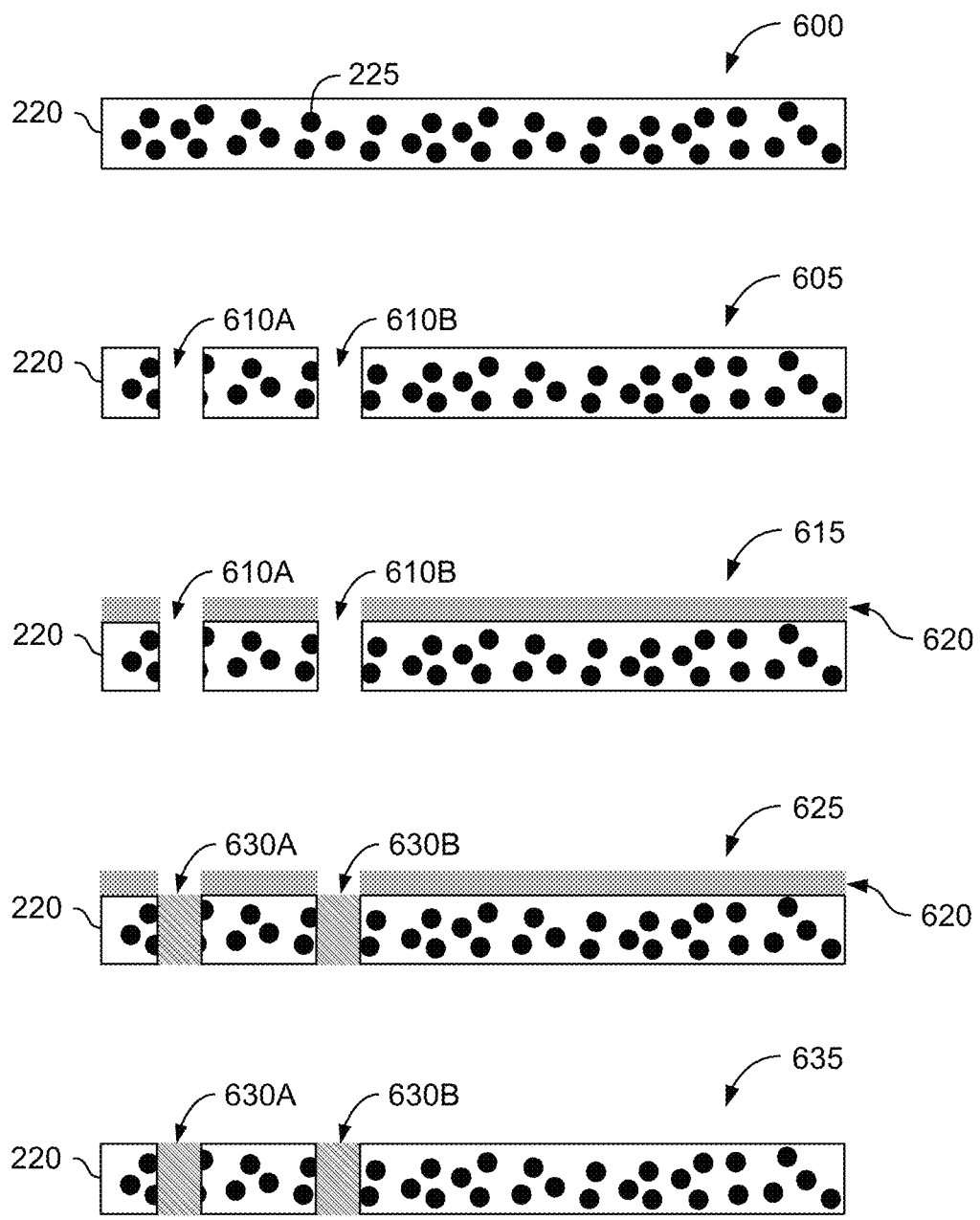
FIG. 6 is a diagram illustrating forming sections of healing layer that do not include a plurality of microcapsules, according to embodiments described herein.

FIG. 6 is a diagram illustrating forming sections of healing layer that do not include a plurality of microcapsules, according to embodiments described herein. The sequence of stages depicted in FIG. 6 generally corresponds to method 500 of FIG. 5, and may further be used in conjunction with other embodiments, such as forming the section 310 of healing layer 220 depicted in FIGS. 3A-3C.

At stage 600, a healing layer 220 comprises a plurality of microcapsules 225. The healing layer 220 may be formed according to techniques discussed above. At stage 605, openings 610A, 610B are formed through the healing layer 220. In some cases, the openings 610A, 610B are formed using a drilling element. At stage 615, a photoresist layer 620 is applied to the healing layer 220. In some embodiments, manufacturing equipment may expose and develop the healing layer after application of the photoresist layer 620 to expand the cavity into an oversized cavity. At stage 625, fill material 630A is applied in opening 610A, and fill material 630B is applied in opening 610B. One or more steps for curing and/or solidifying the fill material 630A, 630B may be performed. At stage 635, the photoresist 620 is removed from the healing layer 220, leaving the healing layer 220 with fill material 630A, 630B included therein.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure.

It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present disclosure, other and further embodiments of the disclosure may be devised without departing from the basic scope thereof, and the scope thereof is determined by the claims that follow.

What is claimed is:

1. A method of forming a conductive via that extends partly through a multi-layer assembly, the method comprising:

forming a cavity from a first surface of the multi-layer assembly to a first depth defined relative to a second surface of the multi-layer assembly opposite the first surface, the cavity extending through a plurality of layers of the multi-layer assembly, the plurality of layers comprising a healing layer comprising a plurality of microcapsules, wherein forming the cavity ruptures some of the plurality of microcapsules to release encapsulated material into the cavity, wherein the released encapsulated material extends within the cavity from the first depth to a second depth that is closer to the first surface than the first depth; and depositing conductive material within the cavity to form the conductive via that extends from the second depth to a third depth that is closer to the first surface than the second depth.

2. The method of claim 1, wherein the deposited conductive material forms a monolithic plug within the cavity.

3. The method of claim 2, wherein the plurality of layers further comprises a dielectric layer having a first relative permittivity, and wherein a second relative permittivity of the monolithic plug is the same as the first relative permittivity.

4. The method of claim 1, wherein the plurality of microcapsules comprises a first plurality of microcapsules that each encapsulate a first reactive monomer solution, and a second plurality of microcapsules that each encapsulate a second reactive monomer solution, wherein releasing encapsulated material into the cavity comprises mixing the first reactive monomer solution and the second monomer solution to form a polymer, and wherein the polymer formed by the released encapsulated material defines the second depth.

5. The method of claim 1, wherein the conductive via couples a first conductive layer and a second conductive layer of the plurality of layers, wherein the healing layer is adjacent to the second conductive layer.

6. The method of claim 1, wherein the healing layer comprises a section that does not include any of the plurality of microcapsules, the method further comprising:

forming a second cavity that extends through the section to a fourth depth defined relative to the second surface; and depositing conductive material within the second cavity to form a second conductive via that extends from the fourth depth to a fifth depth different than the second depth.

7. The method of claim 6, wherein the second cavity extends through the multi-layer assembly, and wherein the second conductive via comprises a through hole via.

8. A method of forming conductive vias that extend at least partly through a multi-layer assembly, the method comprising:

drilling a first cavity from a surface of the multi-layer assembly to a first depth defined relative to the surface, the first cavity extending through a plurality of layers of the multi-layer assembly, the plurality of layers comprising a healing layer comprising a plurality of microcapsules within a first portion, wherein drilling the first cavity ruptures some of the plurality of microcapsules to release encapsulated material into the first cavity, wherein the released encapsulated material extends within the cavity from the first depth to a second depth that is closer to the surface than the first depth;

drilling a second cavity from the surface to a third depth from defined relative to the surface that is different than the second depth, the second cavity extending through a second portion of the healing layer that does not include any of the plurality of microcapsules; and depositing conductive material within each of the first cavity and the second cavity to respectively form a first conductive via extending from the second depth and a second conductive via extending from the third depth.

9. The method of claim 8, wherein the first depth and the third depth are the same.

10. The method of claim 8, wherein the released encapsulated material forms a monolithic plug within the first cavity, wherein the monolithic plug is configured to limit the extent of the first conductive via.

* * * * *